(12) United States Patent
Goto et al.

(10) Patent No.: US 9,349,940 B2
(45) Date of Patent: May 24, 2016

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Yoshiaki Goto, Kiyosu Aichi (JP); Yusuke Akada, Mie Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/636,171

(22) Filed: Mar. 2, 2015

(65) Prior Publication Data

US 2016/0079515 A1    Mar. 17, 2016

(30) Foreign Application Priority Data

Sep. 17, 2014  (JP) ................. 2014-188529

(51) Int. Cl.
| | |
|---|---|
| *H01L 23/552* | (2006.01) |
| *H01L 23/495* | (2006.01) |
| *H01L 21/00* | (2006.01) |
| *H01L 43/02* | (2006.01) |
| *H01L 27/22* | (2006.01) |
| *H01L 43/10* | (2006.01) |
| *H01L 43/12* | (2006.01) |

(52) U.S. Cl.
CPC .............. *H01L 43/02* (2013.01); *H01L 27/222* (2013.01); *H01L 43/10* (2013.01); *H01L 43/12* (2013.01)

(58) Field of Classification Search
CPC ....... H01L 27/222; H01L 43/02; H01L 43/10; H01L 43/12
USPC ......... 257/421, 422, 428, 433, 658, 659, 660, 257/707, E23.021, E23.034, E23.054, 257/E23.067, E23.114, E23.125, E21.499; 361/752; 438/64, 113
See application file for complete search history.

(56) References Cited

U.S. PATENT DOCUMENTS

| | | | | | |
|---|---|---|---|---|---|
| 5,355,016 | A | * | 10/1994 | Swirbel ................. | G11C 16/18 174/389 |
| 5,561,265 | A | * | 10/1996 | Livshits ................. | H01L 23/08 174/386 |
| 5,798,283 | A | * | 8/1998 | Montague ........... | B81C 1/00246 438/200 |
| 7,253,489 | B2 | * | 8/2007 | Na ......................... | G01R 33/05 257/421 |
| 7,808,087 | B2 | * | 10/2010 | Zhao .................... | H01L 23/4334 257/670 |
| 9,030,841 | B2 | * | 5/2015 | Arnold .................. | H01L 23/552 257/659 |
| 9,156,680 | B2 | * | 10/2015 | Kierse .................. | B81B 7/0061 257/659 |

(Continued)

FOREIGN PATENT DOCUMENTS

| | | |
|---|---|---|
| JP | 2009152329 A | 7/2009 |
| JP | 2013093508 A | 5/2013 |
| JP | 2013-207059 A | 10/2013 |

*Primary Examiner* — Dao H Nguyen
(74) *Attorney, Agent, or Firm* — Patterson & Sheridan, LLP

(57) ABSTRACT

A semiconductor device includes a substrate, a magnetic shield plate, a semiconductor element, a sealing layer, and a magnetic shield film. The magnetic shield plate includes a plate portion disposed along the substrate, inclined portions extending in obliquely upward directions from opposite edges of the plate portion, and arcuate portions disposed at tip ends of the inclined portions. The semiconductor element is mounted on the plate portion. The sealing layer seals the semiconductor element and the plate portion and the inclined portions of the magnetic shield plate. At least a part of each of the arcuate portions is exposed on a surface of the sealing layer. The magnetic shield film covers an upper surface of the sealing layer and is in contact with each of the arcuate portions.

20 Claims, 9 Drawing Sheets

(56) References Cited

U.S. PATENT DOCUMENTS

2012/0187551 A1 * 7/2012 Kushino ............... H01L 21/561 257/659

2015/0069545 A1 * 3/2015 Noma ................... H01L 23/552 257/421

* cited by examiner

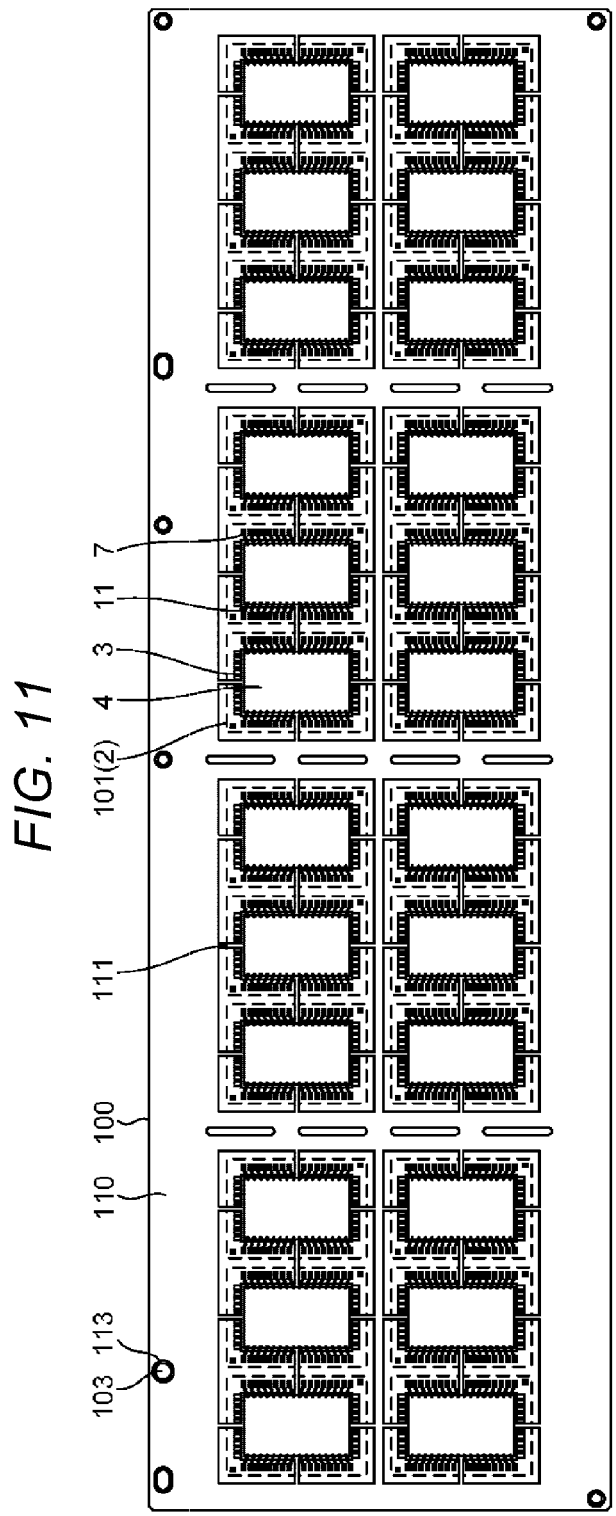

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-188529, filed Sep. 17, 2014, the entire contents of which are incorporated herein by reference.

FIELD

Embodiments described herein relate generally to a semiconductor device.

BACKGROUND

Currently, various types of semiconductor memories are developed. One type of the semiconductor memories, such as a magnetoresistive random access memory (MRAM), stores data based on a magnetic direction. In a magnetic semiconductor memory, data stored in the memory element may be lost due to an influence of an external magnetic field. According to the related art, to protect the magnetic semiconductor memory from the external magnetic field, a magnetic shield layer is disposed along a front surface and a rear surface of the semiconductor chip.

On the rear surface of the semiconductor chip, it is possible to simply dispose the magnetic shield film between the rear surface of the semiconductor chip and a wiring substrate on which the semiconductor chip is mounted. On the front surface of the semiconductor chip, another magnetic shield film having a substantial L-shape may be disposed on a front surface of the semiconductor chip so as to be in contact with the magnetic shield film on the rear surface. In such a structure, a sufficient magnetic shielding effect may not be obtained at an end portion of the semiconductor chip which is not covered with the magnetic shield film of the L-shape.

DESCRIPTION OF THE DRAWINGS

FIG. 11 is a plan view of a structure after the multiple-piece wiring substrate and the multiple-piece magnetic shield plate are bonded.

DETAILED DESCRIPTION

In general, according to one embodiment a semiconductor device includes a substrate, a magnetic shield plate, a semiconductor element, a sealing layer, and a magnetic shield film. The magnetic shield plate includes a plate portion disposed along the substrate, inclined portions extending in obliquely upward directions from opposite edges of the plate portion, and arcuate portions disposed at tip ends of the inclined portions. The semiconductor element is mounted on the plate portion. The sealing layer seals the semiconductor element and the plate portion and the inclined portions of the magnetic shield plate. At least a part of each of the arcuate portions is exposed on a surface of the sealing layer. The magnetic shield film covers an upper surface of the sealing layer and is in contact with each of the arcuate portions.

Figure 1:
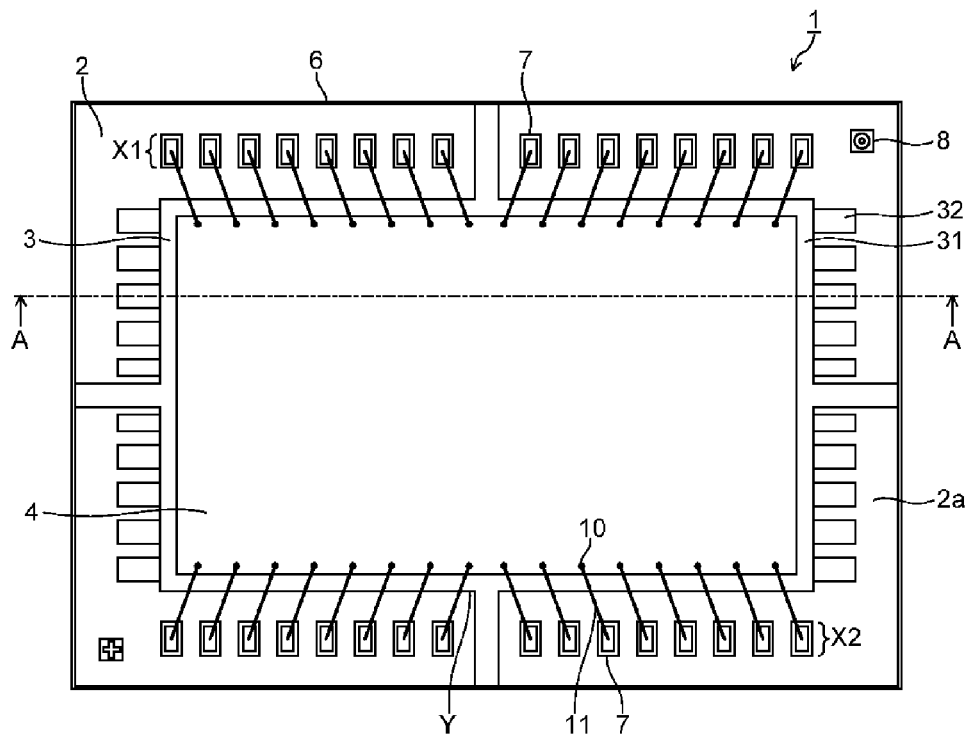
FIG. 1 is a top perspective view of a semiconductor device according to an embodiment.
Figure 2:
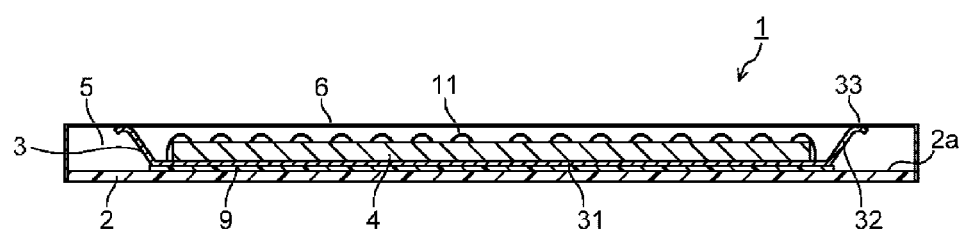
FIG. 2 is a cross-sectional view of the semiconductor device taken along line II-II in FIG. 1.
Figure 3A:
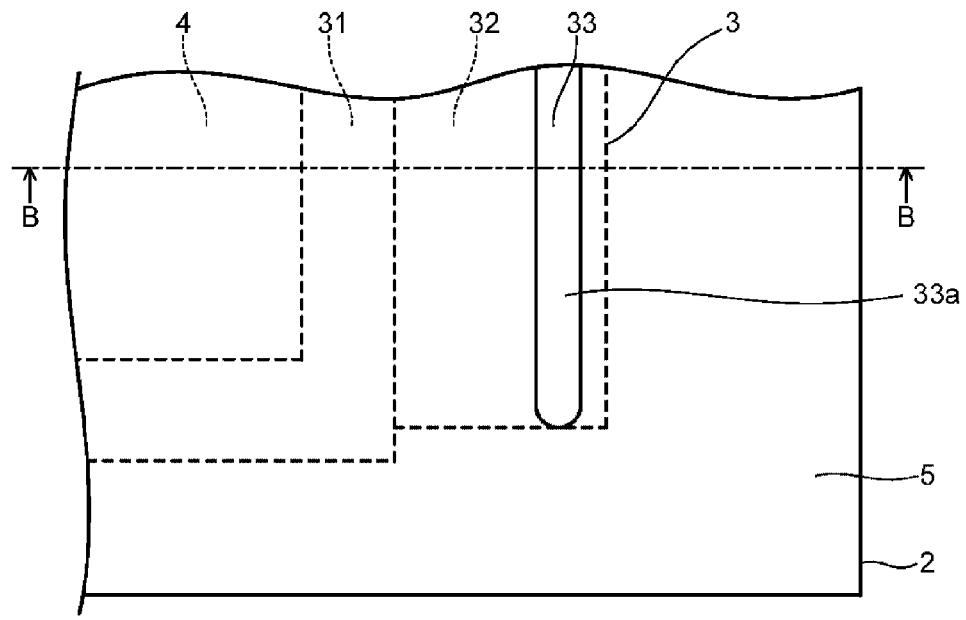
FIGS. 3A and 3B are enlarged view of the semiconductor device before a magnetic shield film is formed.
Figure 3B:
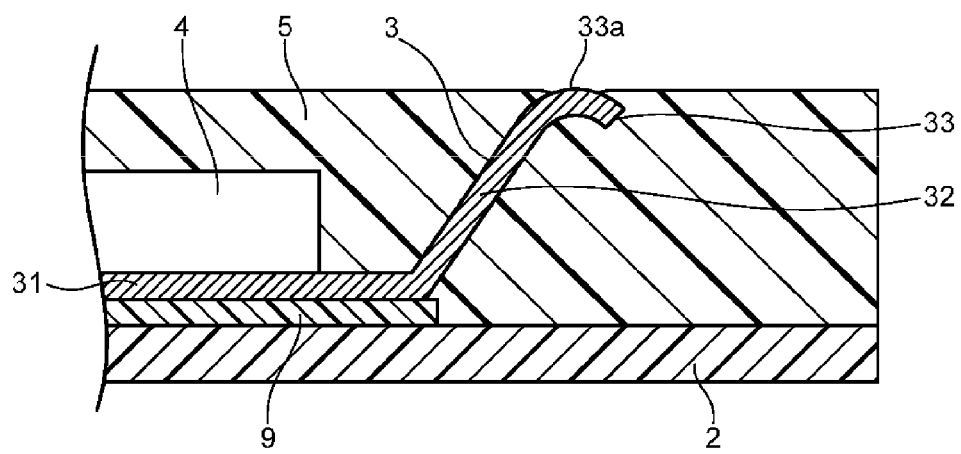
Figure 4:
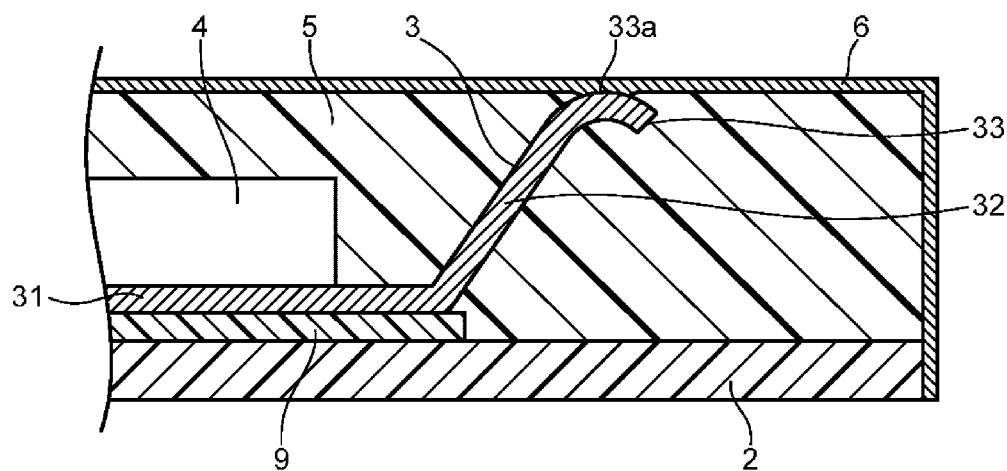
FIG. 4 is an enlarged cross-sectional view of the semiconductor device after the magnetic shield film is formed.

Hereinafter, a semiconductor device of an exemplary embodiment will be described with reference to drawings. FIG. 1 is a top view (top perspective view) of a semiconductor device, and FIG. 2 is a cross-sectional view of the semiconductor device taken along line II-II of FIG. 1. FIGS. 3A and 3B illustrate the semiconductor device before a magnetic shield film is formed illustrated in FIG. 1. FIG. 3A is an enlarged plan view of the semiconductor device before the magnetic shield film is formed, and FIG. 3B is an enlarged cross-sectional view of the semiconductor device taken along line III-III of FIG. 3B. FIG. 4 is a cross-sectional view of the semiconductor device after the magnetic shield film is formed.

A semiconductor device 1 illustrated in FIGS. 1 to 4 includes a substrate 2, a magnetic shield plate 3 which has a substantially U-shaped cross-section mounted onto the substrate 2, a semiconductor chip 4 mounted on the magnetic shield plate 3, a sealing resin layer 5 which seals the magnetic shield plate 3 and the semiconductor chip 4, and a magnetic shield film 6 which covers a front surface of the sealing resin layer 5. Here, a surface of the substrate 2 on which the magnetic shield plate 3 and the semiconductor chip 4 are mounted is referred to as a top surface in a following description.

As the substrate 2, for example, a wiring substrate which includes a wiring network (not illustrated) on a front surface of or within an insulation resin substrate is used. Specifically, a printed wiring board (multilayer printed circuit board and the like) which uses a glass-epoxy resin or a bismaleimide triazine (BT) resin is used. The wiring substrate 2 includes a front surface 2a, which is a mounting surface of a semiconductor chip. The front surface 2a of the wiring substrate 2 includes terminal forming regions X1 and X2 and a chip mounting region Y. The terminal forming regions X1 and X2 are along long sides of the wiring substrate 2 having a rectangular shape, respectively. A connecting terminal 7 to the semiconductor chip 4 is provided in the terminal forming regions X1 and X2. An alignment mark 8 for positioning is provided on the front surface 2a of the wiring substrate 2. The front surface 2a of the wiring substrate 2, except for the connecting terminal 7 or the alignment mark 8, is covered with a solder resist (not illustrated).

The magnetic shield plate 3 of which cross-section is a substantially U shape is mounted on the chip mounting region Y of the front surface 2a of the wiring substrate 2 via the adhesive layer 9. A soft magnetic metal such as iron (Fe), nickel (Ni), cobalt (Co), and the like, or a soft magnetic alloy containing at least one of these soft magnetic metals is used for the magnetic shield plate 3. The soft magnetic alloy includes, for example, silicon steel (Fe—Si), carbon steel (Fe—C), permalloy (Fe—Ni), sendust (Fe—Si—Al), permendur (Fe—Co), ferritic stainless, and the like. The same soft magnetic materials may be used for the magnetic shield film 6. The soft magnetic materials same as the magnetic shield plate 3 may be used for the magnetic shield film 6. Alternatively, different soft magnetic materials may be also used.

The magnetic shield plate 3 includes a plate portion 31 having a rectangular shape which is equal to or larger than the semiconductor chip 4 having a rectangular shape. The plate portion 31 of the magnetic shield plate 3 is mounted to the chip mounting region Y via the adhesive layer 9. The plate portion 31 of the magnetic shield plate 3 has a flat plate shape with long sides along the terminal forming regions X1 and X2 and short sides perpendicular to the long sides. An inclined portion 32 is provided on each of the short sides of the plate portion 31. The inclined portion 32 is provided so as to be extend diagonally (obliquely) upward to outside from the edge of the plate portion 31. An arcuate portion 33 is provided at the tip end of each of the inclined portions 32. A specific shape of the magnetic shield plate 3 will be described in detail.

The semiconductor chip 4 is mounted on the plate portion 31 of the magnetic shield plate 3 via the adhesive layer (not illustrated). The semiconductor chip 4 includes, for example, a magnetoresistive random access memory (MRAM) element. However, the semiconductor chip 4 is not limited thereto, and may be another semiconductor chip which is preferred to be protected from an external magnetic field. The semiconductor chip 4 includes an electrode pad 10 provided along two long sides positioned in the vicinity of the terminal forming regions X1 and X2. Each of the electrode pads 10 of the semiconductor chip 4 is electrically connected to the connecting terminal 7 provided in the terminal forming regions X1 and X2 through a bonding wire 11 such as a gold (Au) wire.

The sealing resin layer 5 which seals the magnetic shield plate 3 and the semiconductor chip 4 together with the bonding wire 11 and the like is formed on the front surface 2a of the wiring substrate 2. However, at least a part of the arcuate portion 33 provided at a tip end of the inclined portion 32 of the magnetic shield plate 3 is exposed on the surface of the sealing resin layer 5. The arcuate portion 33 includes an exposed portion 33a which is exposed on the surface of the sealing resin layer 5 as illustrated in FIG. 3. The magnetic shield film 6 is formed on an upper surface and side surfaces of the sealing resin layer 5. A front surface of the sealing resin layer 5 is covered with the magnetic shield film 6. The magnetic shield film 6 is in contact with the exposed portion 33a of the arcuate portion 33 as illustrated in FIG. 4. The magnetic shield film 6 is formed by, for example, a plating method, a sputtering method, a coating method of a conductive paste, and the like.

A shape of the magnetic shield plate 3, an exposed portion of the magnetic shield plate 3 that is exposed on the surface of the sealing resin layer 5, and a contact structure between the magnetic shield plate 3 and the magnetic shield film 6 will be described with reference to FIGS. 3A to 8. The magnetic shield plate 3 includes the plate portion 31, the inclined portion 32, and the arcuate portion 33 as described above. The plate portion 31 has a rectangular shape equal to or larger than the semiconductor chip 4 of a rectangular shape. A rear surface of the semiconductor chip 4 is covered by the plate portion 31. The inclined portion 32 is provided so as to be inclined to an outside direction of the plate portion 31 with respect to a direction perpendicular to the plate portion 31 and extends from the edge (both ends of a short side) of the plate portion 31.

Figure 5A:
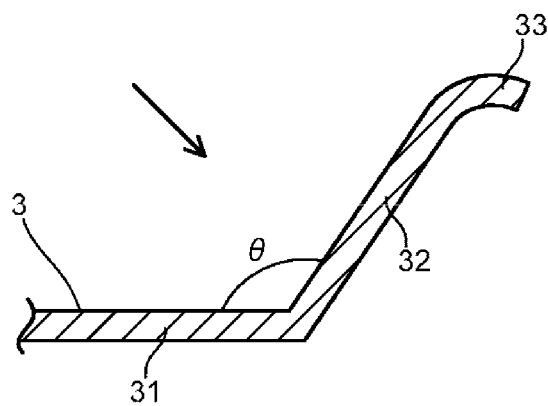
FIGS. 5A and 5B are enlarged views of a magnetic shield plate according to a first configuration example.
Figure 5B:
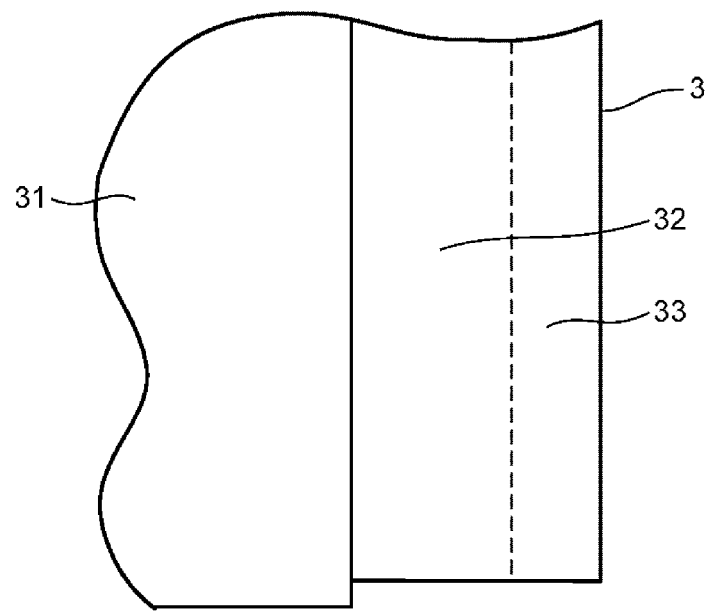

The inclined portion 32, as illustrated in FIG. 5, is provided on a short side edge of each of the plate portions 31 so that an inclination angle (angle between the plate portion 31 and the inclined portion 32) θ is an obtuse angle. FIG. 5A is an enlarged cross-sectional view of the plate portion 31, the inclined portion 32, and the arcuate portion 33 of the magnetic shield plate 3, and FIG. 5B is a view of the plate portion 31, the inclined portion 32, and the arcuate portion 33 in an arrow direction of FIG. 5A. The inclined portion 32 has a spring property since the inclination angle θ is an obtuse angle. Since the inclined portion 32 with a spring property is provided at edges of the plate portions 31 as a portion extending upward, it is possible to reliably expose the magnetic shield plate 3 on the surface of the sealing resin layer 5 even when there is a variation in a bending process of a soft magnetic plate configuring the magnetic shield plate 3, a variation in a thickness of the sealing resin layer 5, or the like.

The inclination angle θ of the inclined portion 32 is preferably between 120 degrees and 150 degrees, and is for example about 135 degrees. When the degree is in this range, the inclined portion 32 can have an adequate spring property, and at the same time the semiconductor chip 4 can be contained within a volume defined by the magnetic shield plate 3 having the inclined portion 32 as the portions extending upward. That is, the semiconductor chip 4 can fit in a container shape portion formed by the plate portion 31 and the inclined portion 32. When the inclination angle θ is too small, a spring property of the inclined portion 32 is reduced. When the inclination angle θ is too large, the semiconductor chip 4 may not be contained within the volume formed by the magnetic shield plate 3. When the inclined portion 32 is made to be longer so that the semiconductor chip 4 is entirely contained within the volume, the semiconductor device 1 would become large.

The arcuate portion 33 is provided at the tip end of the inclined portion 32 so that a shape of the exposed portion can be uniform when the arcuate portion 33 is exposed on the surface of the sealing resin layer 5. The arcuate portion 33 is curved towards the wiring substrate 2. By providing the arcuate portion 33 at the tip end of the inclined portion 32, a shape of the exposed portion of the arcuate portion 33 viewed from a top can be substantially uniform when a height of the tip end of the inclined portion 32 is adjusted using the spring property of the inclined portion 32. It is possible to reliably expose a portion 33a of the arcuate portion 33 provided at the tip end of the inclined portion 32 on the surface of the sealing resin layer 5. Accordingly, since the magnetic shield film 6 is stably in contact with the magnetic shield plate 3, it is possible to form a good magnetic circuit using the magnetic shield plate 3 and the magnetic shield film 6.

That is, a lower surface of the semiconductor chip 4 and short side surfaces of the semiconductor chip 4 are covered with the magnetic shield plate 3. Furthermore, an upper surface and all side surfaces of the semiconductor chip 4 are covered with the magnetic shield film 6, which forms a magnetic circuit by being in contact with the magnetic shield plate 3. A magnetic field line generated outside the semiconductor device 1 extends along a magnetic shield formed by the magnetic shield plate 3 and the magnetic shield film 6, so that it is possible to effectively prevent the magnetic field line from entering into an inside of the semiconductor device 1. Accordingly, it is possible to effectively obtain a magnetic shielding property with respect to the semiconductor chip 4.

There are several methods for exposing a portion of the arcuate portion 33 of the magnetic shield plate 3 on the surface of the sealing resin layer 5. For example, the arcuate portion 33 of the magnetic shield plate 3 is in contact with a cavity surface of a mold used in forming the sealing resin layer 5, specifically a mold which forms a filling space of the sealing resin layer 5. A portion (a contact portion with a mold)

of the arcuate portion 33 is exposed on the surface the sealing resin layer 5 by forming the sealing resin layer 5 in a state where the arcuate portion 33 is in contact with the mold. When the arcuate portion 33 is in contact with the mold, the inclined portion 32 is extended in a transverse direction in accordance with the spring and the slipperiness of the arcuate portion 33 having the inclination angle θ with respect to the inclined portion 32. Therefore, even if there is a variation in process accuracy of the soft magnetic plate or a thickness of the sealing resin layer 5, it is possible to stably cause the arcuate portion 33 to be in contact with the mold.

Furthermore, as the arcuate portion 33 has a substantially uniform shape when in contact with the mold, it is possible to forma uniform shape of the exposed portion 33a that is exposed on the surface of the sealing resin layer 5 of the arcuate portion 33. It is preferable to set a curvature radius R of the arcuate portion 33 considering contestability with the mold, a size of a device, or the like. In addition, considering a variation in a volume of the magnetic shield plate 3 or a variation in a thickness of the sealing resin layer 5, it is preferable that a height from the plate portion 31 of the magnetic shield plate 3 to the tip end surface of the arcuate portion 33 be set so that the arcuate portion 33 fits in the mold even when these variations occur. In the molding process, it is preferable to use a sheet mold type molding, which uses a sheet to prevent a mold contamination. According to such a molding, the arcuate portion 33 would be in contact with the sheet on the cavity, and the arcuate portion 33 would be exposed on the surface of the sealing resin layer 5 as the arcuate portion 33 is cut into the sheet.

To form the sealing resin layer 5, any one of a transfer molding and a compression molding may be employed. For example, when the sealing resin layer 5 is formed by the compression molding, a sealing resin material and an apparatus to be sealed (a unknit to be sealed or a unit in which the magnetic shield plate 3 and the semiconductor chip 4 are mounted on the substrate 2) are disposed in volume formed by a pair of compression molds, heat and pressure are applied to the pair of compression molds which is closed, and the magnetic shield plate 3 or the semiconductor chip 4 is covered with a resin material fluidized with heat. When a pressure is applied to the pair of compression molds, the arcuate portion 33 of the magnetic shield plate 3 can be in contact with the compression mold.

Another method of exposing the arcuate portion 33 of the magnetic shield plate 3 on the surface of the sealing resin layer 5 would be a method of embedding the inclined portion 32 having the arcuate portion 33 in the sealing resin layer 5 and grinding an upper surface of the sealing resin layer 5 until the arcuate portion 33 appears. Even in this case, it is possible to increase an exposed area of the arcuate portion 33 on the surface of the sealing resin layer 5 according to a shape of the arcuate portion 33 and the like. However, since an amount of grinding of the sealing resin layer 5 should be accurate and it costs to grind the sealing resin layer 5, it is more preferable to employ the above-described method of causing the arcuate portion 33 to be in contact with the mold, that is, a method of exposing the arcuate portion 33 on the surface of the sealing resin layer 5 without grinding the sealing resin layer 5. Accordingly, it is possible to stably form the arcuate portion 33 exposed on the surface of the sealing resin layer 5, and further the semiconductor device 1 having the magnetic shield film 6 in contact with the exposed portion 33a of the arcuate portion 33, at a low cost.

Figure 6:
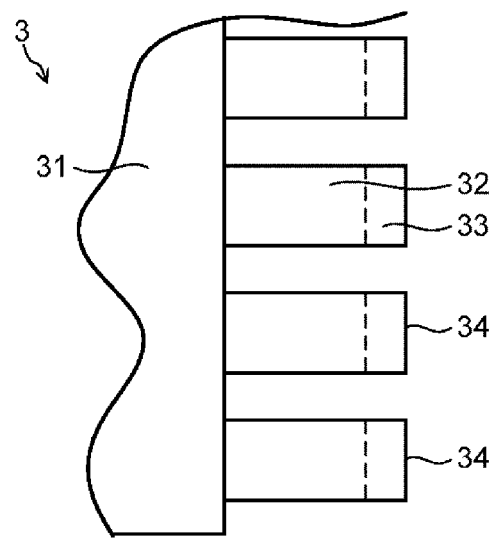
FIG. 6 is an enlarged view of a magnetic shield plate according to a second configuration example.
Figure 7:
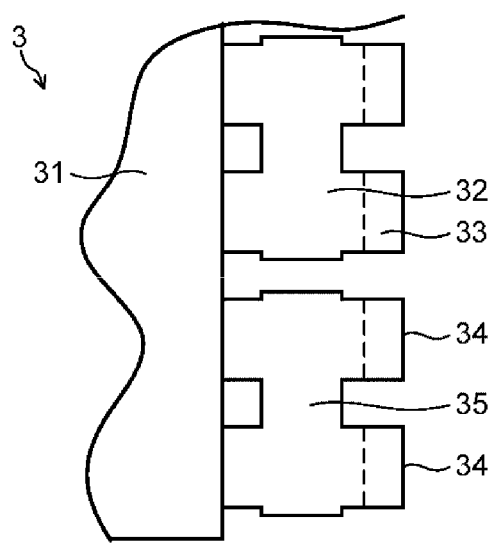
FIG. 7 is an enlarged view of a magnetic shield plate according to a third configuration example.
Figure 8:
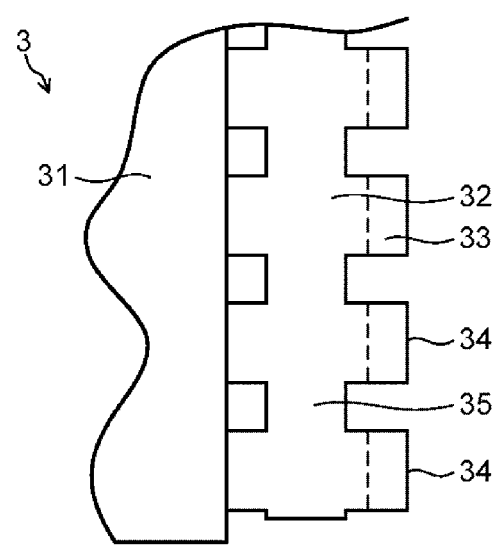
FIG. 8 is an enlarged view of a magnetic shield plate according to a fourth configuration example.

Then, a planar shape of the inclined portion 32 of the magnetic shield plate 3 will be described. From a viewpoint of the magnetic shielding property of the magnetic shield plate 3, it is preferable that the planar shape of the inclined portion 32 be a solid plate shape (flat shape) as illustrated in FIG. 5B. Alternatively, in order to uniformly form the arcuate portion 33, it is preferable to form the inclined portion 32 as illustrated in FIGS. 6 to 8. That is, when the arcuate portion 33 is in contact with a mold and is deformed to be extended in a transverse direction, a bending moment is the largest at a root portion of the inclined portion 32, that is, a connection portion with the plate portion 31. When the planar shape of the inclined portion 32 is set to a solid plate shape in which the root portions are connected to each other, it is necessary to add a relatively large force to uniformly deform the inclined portion 32.

With respect to this point, it is effective to divide the inclined portion 32 into a plurality of pieces in a direction parallel to an end direction (a short side direction of the plate portion 31) of the plate portion 31 as illustrated in FIGS. 6 to 8. The inclined portion 32 illustrated in FIGS. 6 to 8 includes a plurality of inclined divided pieces 34. The plurality of inclined divided pieces 34 include the arcuate portions 33 each provided at a tip end. The inclined divided pieces 34 can be easily deformed compared to the inclined portion 32 of a solid plate shape, and therefore it is possible to uniformly form the arcuate portion 33 provided at the tip end and exposed on the surface of the sealing resin layer 5. In addition, the magnetic field lines generated outside the semiconductor device 1 are attracted in a direction in which a soft magnetic material is present and tend to pass through the soft magnetic material. As a result, it is possible to obtain a magnetic shielding effect even through there is a gap between the inclined divided pieces 34.

In order to increase the magnetic shielding effect of the inclined portion 32 having the plurality of inclined divided pieces 34, as illustrated in FIGS. 7 and 8, it is effective to connect between adjacent inclined divided pieces 34 in a direction parallel to the end direction of the plate portion 31, using the connection piece 35. The connection piece 35 is provided between a portion connected to the plate portion 31 of the inclined divided piece 34 and the arcuate portion 33 of the inclined divided piece 34. The connection piece 35 may be provided such that only two divided pieces 34 are connected as illustrated in FIG. 7, and may be provided such that three or more inclined divided pieces 34 are connected as illustrated in FIG. 8. A connection structure of the inclined divided pieces 34 by the connection piece 35 may be appropriately selected in view of the exposure stability and the shield effect of the arcuate portion 33.

As described above, from the viewpoint of the magnetic shielding property of the magnetic shield plate 3, it is preferable that the planar shape of the inclined portion 32 be a solid plate shape. However, in this case, the exposure stability of the arcuate portion 33 may be lower relative to other configurations. On the other hand, with regard to the exposure stability of the arcuate portion 33, it is preferable to have a configuration by dividing the inclined portion 32 into a plurality of inclined divided pieces 34 as illustrated in FIG. 6. However, in this case, the magnetic shielding effect may be lower relative to the other configurations. As illustrated in FIGS. 7 and 8, the inclined portion 32 including the plurality of inclined divided pieces 34 and the connection piece 35 connecting the pieces may be acceptable in both respects. The planar shape of the inclined portion 32 may be appropriately selected in view of the exposure stability and the shield effect of the arcuate portion 33.

Figure 9:
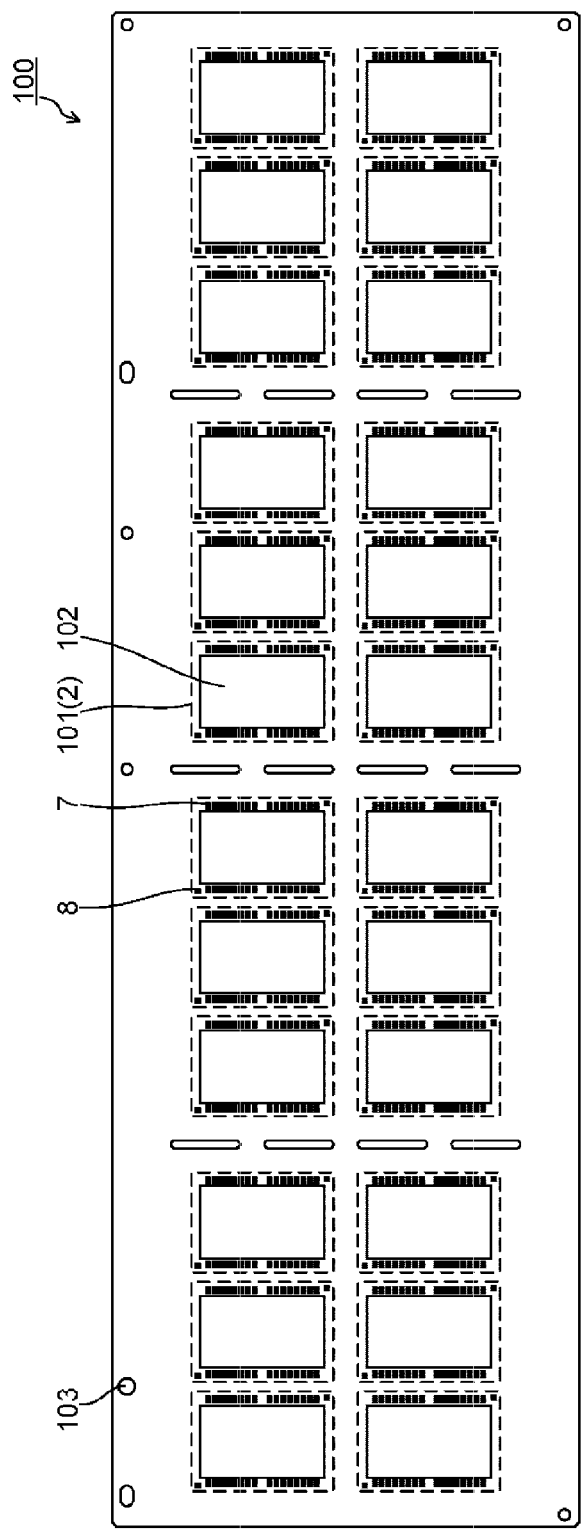
FIG. 9 is a plan view of a multiple-piece wiring substrate used for manufacturing the semiconductor device.

Then, a manufacturing process of the semiconductor device 1 will be described with reference to FIGS. 9 to 11. However, a manufacturing process described below is an example of the manufacturing process of the semiconductor device 1, and the manufacturing process of the semiconductor device 1 is not limited thereto. FIG. 9 illustrates a multiple-piece set substrate 100, which includes a plurality of the device formation regions 101 which will be divided into a plurality of the wiring substrates 2. The plurality of device formation regions 101 includes the connecting terminals 7, respectively. Furthermore, the bond film 102, which corresponds to the adhesive layer 9, is bonded to a chip mounting region of each of the device formation regions 101. It is preferable that the bond film 102 have a larger shape than the plate portion 31 of the magnetic shield plate 3. The set substrate 100 includes a plurality of round holes 103 for transporting and positioning thereof in a manufacturing device.

The bond film 102 which bonds the magnetic shield plate 3 to the wiring substrate 2 may be disposed on the wiring substrate 2 during a manufacturing process thereof, on the magnetic shield plate 3, or on the wiring substrate 2 immediately before the magnetic shield plate 3 is bonded, or the like. When the bond film 102 is bonded to the magnetic shield plate 3 in advance, it is necessary to support the plate portion 31 not the inclined portion 32 when bonding the bond film. 102, and a shape of a bonding tool may become complicated. In addition, in terms of bonding position accuracy, it is preferable that the bond film 102 have a size smaller than that of the plate portion 31. As a result, an elongated gap is likely to be produced between the magnetic shield plate 3 and the wiring substrate 2 after the magnetic shield plate 3 is bonded to the wiring substrate 2. This is not preferable when resin-sealing is performed.

In contrast, when the bond film 102 is bonded to the wiring substrate 2 in advance, it is possible to use a bond film 103 larger than the plate portion 31. As a result, the resin-sealing can be preferably performed. Furthermore, when the bond film 103 is bonded to a flat wiring substrate 2, the shape of the bonding tool may be simplified. Here, the bond film 102 is mounted to each device formation region 101 of the set substrate 100. The method of mounting the bond film 102 to the wiring substrate 2 right before the magnetic shield plate 3 is bonded may not be preferable because a manufacture line may become long.

Figure 10:
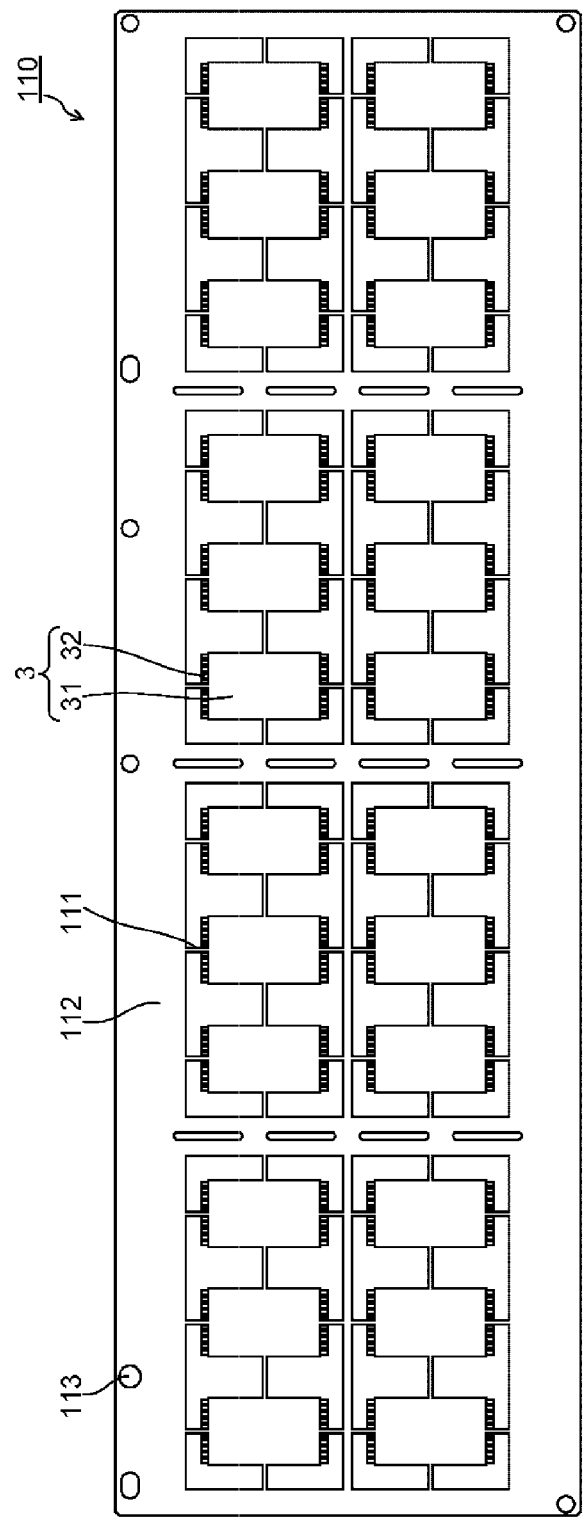
FIG. 10 is a plan view of a multiple-piece magnetic shield plate used for manufacturing the semiconductor device.

FIG. 10 illustrates a set shield plate 110 which includes a plurality of magnetic shield plates 3 connected to a frame 112 with support portions 111. The set shield plate 110 includes a plurality of round holes 113 of which a size is slightly larger than the round holes 103 formed in the set substrate 100. This is because transporting and positioning of the set substrate 100 is performed in the manufacturing device using the round holes 103 considering a positional displacement when bonding the set substrate 100 and the set shield plate 110. As illustrated in FIG. 11, the set shield plate 110 is mounted onto the set substrate 100. Bonding between the set substrate 100 and the set shield plate 110 is performed by bonding each of the magnetic shield plates 3 to the corresponding device formation region 101 with the bond film 102.

The semiconductor chip 4 is mounted onto each magnetic shield plate 3 of the set shield plate 110, and an electrode of the semiconductor chip 4 and the connecting terminal 7 of the device formation region 101 are electrically connected through the bonding wires 11. A laminate of the set shield plate 110 and the semiconductor chips 4 bonded thereon is placed in a mold of the sealing apparatus. At this time, the laminate is disposed in the mold so that the arcuate portion 33 of each magnetic shield plate 3 is in contact with the mold. The sealing resin layer 5 which seals the magnetic shield plate 3 and the semiconductor chip 4 is formed on each device formation region 101 of the laminate. The sealing resin layer 5 is formed so as to collectively seal the plurality of device formation regions 101. Such a resin sealing body is divided into each device formation region 101. At this time, the support portions 111 of the set shield plate 110 are also cut off. The magnetic shield film 6 is formed on a device surface after the division. As a result, the semiconductor device 1 according to the embodiment, that is, a semiconductor package with a magnetic shielding function, can be manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a magnetic shield plate that includes a plate portion disposed along the substrate, inclined portions extending in obliquely upward directions from opposite edges of the plate portion, and arcuate portions disposed at tip ends of the inclined portions;
   a semiconductor element mounted on the plate portion;
   a sealing layer sealing the semiconductor element and the plate portion and the inclined portions of the magnetic shield plate, at least a part of each of the arcuate portions being exposed on a surface of the sealing layer; and
   a magnetic shield film covering an upper surface of the sealing layer and in contact with each of the arcuate portions.

2. The device according to claim 1, wherein a single inclined portion is formed with respect to each of the opposite edges of the plate portion.

3. The device according to claim 1, wherein a plurality of inclined portions is formed with respect to each of the opposite edges of the plate portion.

4. The device according to claim 3, wherein the plurality of inclined portions extends in parallel to each other from each of the edges of the plate portion.

5. The device according to claim 3, wherein
   the plurality of inclined portions includes two portions extending in parallel to each other from each of the edges of the plate portions and a connecting portion extending along the edge of the plate portion and connected between the two portions.

6. The device according to claim 1, wherein the semiconductor element includes a magnetoresistive random access memory element.

7. The device according to claim 1, wherein the magnetic shield plate and the magnetic shield film include a soft magnetic material.

8. The device according to claim 7, wherein the soft magnetic material is iron, nickel or cobalt.

9. The device according to claim 1, wherein side surfaces of the sealing layer is also covered with the magnetic shield film.

10. The device according to claim 1, wherein a degree between the plate portion and the inclined portion is equal to or greater than 120° and equal to or smaller than 150°.

11. A method for manufacturing a semiconductor device, comprising:
    mounting a magnetic shield plate on a substrate, the magnetic shield plate including a plate portion disposed along the substrate, inclined portions extending in obliquely upward directions from opposite edges of the plate portion, and arcuate portions disposed at tip ends of the inclined portions;

mounting a semiconductor element on the plate portion;

sealing the semiconductor element and the plate portion and the inclined portions of the magnetic shield plate with a sealing layer, such that at least a part of each of the arcuate portions being exposed on a surface of the sealing layer; and covering an upper surface of the sealing layer with a magnetic shield film, such that the magnetic shield film is in contact with each of the arcuate portions.

12. The method according to claim 11, wherein a single inclined portion is formed with respect to each of the opposite edges of the plate portion.

13. The method according to claim 11, wherein a plurality of inclined portions is formed with respect to each of the opposite edges of the plate portion.

14. The method according to claim 13, wherein the plurality of inclined portions extends in parallel to each other from each of the edges of the plate portion.

15. The method according to claim 13, wherein
the plurality of inclined portions includes two portions extending in parallel to each other from each of the edges of the plate portions and a connecting portion extending along the edge of the plate portion and connected between the two portions.

16. The method according to claim 11, wherein the semiconductor element includes a magnetoresistive random access memory element.

17. The method according to claim 11, wherein the magnetic shield plate and the magnetic shield film include a soft magnetic material.

18. The method according to claim 17, wherein the soft magnetic material is iron, nickel or cobalt.

19. The method according to claim 11, further comprising:
covering side surfaces of the sealing layer with the magnetic shield film.

20. The method according to claim 11, wherein a degree between the plate portion and the inclined portion is equal to or greater than 120° and equal to or smaller than 150°.

* * * * *